(12) United States Patent
Chen et al.

(10) Patent No.: US 10,687,438 B2
(45) Date of Patent: Jun. 16, 2020

(54) RAIL ASSEMBLY FOR STORAGE RACK

(71) Applicant: QUANTA COMPUTER INC., Taoyuan (TW)

(72) Inventors: Chao-Jung Chen, Taoyuan (TW); Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/216,017

(22) Filed: Dec. 11, 2018

(65) Prior Publication Data

US 2020/0077536 A1   Mar. 5, 2020

Related U.S. Application Data

(60) Provisional application No. 62/723,778, filed on Aug. 28, 2018.

(51) Int. Cl.
*H05K 7/18* (2006.01)
*H05K 5/02* (2006.01)

(52) U.S. Cl.
CPC .......... *H05K 7/183* (2013.01); *H05K 5/0204* (2013.01); *H05K 5/0221* (2013.01)

(58) Field of Classification Search
CPC ..... H05K 7/183; H05K 5/0221; H05K 5/0204
See application file for complete search history.

(56) References Cited

U.S. PATENT DOCUMENTS

| | | | |
|---|---|---|---|
| 6,220,456 B1 | 4/2001 | Jensen et al. | |
| 6,442,030 B1* | 8/2002 | Mammoser | G06F 1/1601 248/917 |
| 7,382,623 B2* | 6/2008 | Hartman | H05K 7/1421 211/162 |
| 8,437,123 B2* | 5/2013 | Sun | H05K 7/1489 312/311 |
| 9,007,084 B2* | 4/2015 | Babcock | G01R 31/2808 324/756.01 |
| 2003/0150823 A1 | 8/2003 | Dean et al. | |
| 2017/0181312 A1 | 6/2017 | Chen et al. | |
| 2019/0059170 A1* | 2/2019 | Lee | H05K 5/0221 |

FOREIGN PATENT DOCUMENTS

| | | |
|---|---|---|
| EP | 3258755 A1 | 12/2017 |
| EP | 3273757 A1 | 1/2018 |

OTHER PUBLICATIONS

Extended European Search Report for EP Application No. 19165850.9 dated Nov. 15, 2019.

* cited by examiner

*Primary Examiner* — Rockshana D Chowdhury
(74) *Attorney, Agent, or Firm* — Nixon Peabody LLP

(57) ABSTRACT

The present disclosure provides a rail assembly for a computing device in a storage rack. The rail assembly can include a rail body, a rail member, and a locking ear. The rail body can engage with a front vertical portion of the storage rack and a rear vertical portion of the storage rack. The rail member can attach to the rail body, and include a slot extending horizontally along the rail member. This slot can slidably receive a plurality of pins disposed along a side surface of the computing device. The present disclosure also provides for a first locking ear to support a first orientation of the computing device and a second locking ear to support a second orientation of the computing device.

20 Claims, 7 Drawing Sheets

RAIL ASSEMBLY FOR STORAGE RACK

CROSS REFERENCE TO RELATED APPLICATIONS

This application claims priority under 35 U.S.C. § 119 to U.S. Provisional Application No. 62/723,778, entitled, "NEW TYPE STATIC RAIL KITS," and filed on Aug. 28, 2018. The contents of that application are hereby incorporated by reference in their entirety.

FIELD

The present disclosure relates to a rail assembly for a computing device in a storage rack.

BACKGROUND

Storage racks can hold a plurality of computer chassis by providing pairs of rails for loading each computer chassis. Locking ears can lock each computer chassis in a horizontal position on a pair of rails. In conventional systems, the locking ears attach to a front portion of the computer chassis and a front portion of the rails. This configuration limits the loading of a computer chassis to only one orientation, where a back portion of the computer chassis must be loaded into the back of the storage rack. In some cases, it might be preferable to load a computer chassis into a storage rack in an inverse orientation, such that a back portion of the computer chassis is accessible at the front of the storage rack. The back portion of the computer chassis can hold most of the server's input and output ports, so many users would prefer to access this back portion.

However, conventional storage rack systems and rail assemblies do not provide locking ears which can attach to the structures on the back of a computer chassis. For example, most locking ears interfere with inner posts of the rack which prevent the same locking ear from being used for a front-loading and rear-loading computer chassis.

Additionally, the locking ear is the only stabilization piece in conventional rail assemblies in a storage rack. This locking ear provides a front point of attachment to lock a front portion of the computer chassis in place, while a back portion of the computer chassis is free floating. This allows the back portion of the computer chassis to shake during shipping, or movement of the storage rack generally. Such movement can cause wear on and damage to the computing devices housed within the computer chassis. Some conventional designs provide a rear stabilization mechanism to prevent the computer chassis from bouncing during shipping; however, these conventional designs require the shipping container to be the perfect distance from the computer chassis.

Therefore, what is needed is a rail kit assembly that can provide more stability for computer components. An exemplary rail kit assembly can also provide flexibility for how chassis are loaded into the storage rack. An exemplary rail kit assembly does not require a pre-determined distance from a shipping container.

SUMMARY

The various examples of the present disclosure are directed towards a rail assembly for a computing device in a storage rack. The storage rack can have front vertical portions and opposing rear vertical portions. The rail assembly can include a rail body, a rail member, and a locking ear. The rail body can engage with one of the front vertical portions and an opposing rear vertical portion. The rail member can be attached to the rail body and have a slot extending horizontally along the rail member. This slot can slidably receive a plurality of pins disposed along a side surface of the computing device. The locking ear can fix a horizontal position of the computing device along the rail member. The locking ear can further support one of a first orientation or a second orientation of the computing device in the storage rack.

In some examples, the rail member can be a C-shaped rail.

In some examples, the computing device can include a first end and a second end. In the first orientation, the first end can be positioned adjacent to the front vertical portions of the storage rack. In the second orientation, the second end can be positioned adjacent to the front vertical portions.

In some examples, the locking ear can include a facing surface and a tab. The facing surface can attach to the front vertical portions of the storage rack. The tab can attach to the computing device. Such a locking ear can secure the computing device in the first orientation. In some examples, the facing surface can be substantially perpendicular to the tab.

In some examples, the locking ear can include a first end and a second end. The first end can attach to the computing device, and the second end can couple with the rail body. Such a locking ear can configure the computing device in the second orientation. The second end can include a plunger. The plunger can include a lip and an indented portion. Such a locking ear can further include a middle portion, which extends away from the first end at an angle. The angled extension of the middle portion can allow the indented portion of the plunger to be in line with the first end. The rail body can include an opening to receive the plunger.

A second embodiment of the present disclosure can provide for a storage rack configured to house a plurality of computing devices. The storage rack can include front vertical portions, rear vertical portions, a plurality of rail bodies, a plurality of rail members, and a plurality of locking ears. The front vertical portions can oppose the rear vertical portions. Each rail body can engage with one front vertical portion and an opposing rear vertical portion. Each rail member can be attached to a rail body. Each rail member can include a horizontal slot along the rail member. This horizontal slot can slidably receive a plurality of pins disposed along a side surface of a computing device. Each locking ear can fix a horizontal position of a computing device along a rail member. Each locking ear can support one of a first orientation or a second orientation of a computing device. Additional exemplary features of the second embodiment can be included as discussed above with regards to the first embodiment.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention.

The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
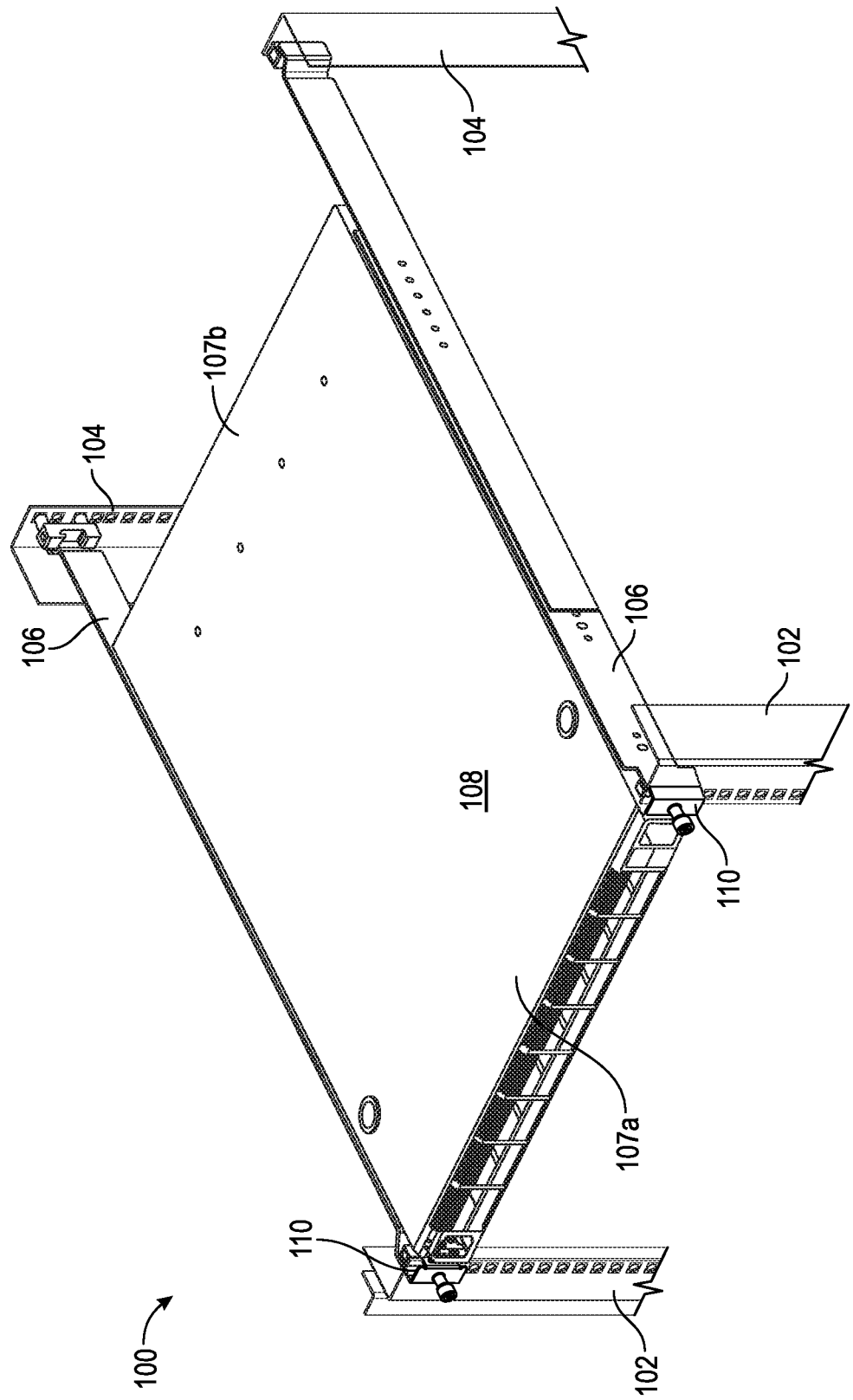
FIG. 1 shows a computer chassis loaded onto a rail kit, according to the prior art.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure is directed to a rail assembly in a storage rack that includes a rail body, a rail member, and a locking ear. The rail body can engage with front and rear portions of the storage rack, and provide structural support to receive a computer chassis. The rail member can have a slot configured for slidably receiving pins along the side edge of a computer chassis. These pins provide additional structural support along the length of the computer chassis to stabilize the computer chassis during shipping or movement of the storage rack. Lastly, the present disclosure provides for two alternative locking ears. A first locking ear can allow the computer chassis to be loaded into the storage rack with a front end of the computer chassis accessible to a user, and the second locking ear can provide for an inverse orientation such that a rear end of the computer chassis is accessible to a user.

FIG. 1 shows a system 100 of a chassis loaded in a storage rack, according to the prior art. System 100 can include front vertical portions 102, rear vertical portions 104, rail bodies 106, a computing device 108, and locking ears 110.

A storage rack can have front vertical portions 102 and rear vertical portions 104. Both vertical portions 102 and 104 can have a plurality of slots configured for receiving rail bodies 106 and locking ears 110. Although FIG. 1 shows a single pair of rail bodies 106, storage racks can provide for a plurality of rail bodies 106 configured to receive a plurality of computing devices such that the computing devices are stacked on top of each other. As shown in FIG. 1, a rail body 106 can extend between a front vertical portion 102 and an opposing rear vertical portion 104. A computing device 108 can be loaded into the pair of rail bodies 106. Locking ear 110 can secure the computing device 108 in the rail bodies 106. System 100 only provides for locking ear 110 to interface with a first end 107a of the computing device 108. Locking ear 110 cannot interface with a second end 107b of the computing device 108 because it would interfere with portions of the vertical posts 104.

System 100 allows for only a first orientation of loading the computing device 108. The second end 107b of the computing device 108 must be loaded onto the rail bodies 106 first, such that the first end 107a of the computing device 108 is accessible by a user once the computing device 108 has been loaded into the storage rack. Therefore, system 100 does not provide an orientation where the second end 107b of the computing device 108 is accessible once the computing device 108 has been loaded.

After loading the computing device 108, a locking ear 110 can be attached to the front vertical portions 102 and the rail body 106. This locking ear 110 therefore locks a horizontal position of the computing device 108 with the rail bodies 106 and the front vertical portions 102. However, system 100 does not provide any stability mechanism for the second end 107b of the computing device. Therefore, the second end 107b can be floating and unattached to the rail bodies 106 or rear vertical portions 104. When multiple computer devices are loaded on top of each other, the computer devices might press against each other during rack movement. This can damage the devices themselves or the sensitive components housed in the computer devices.

Figure 2A:
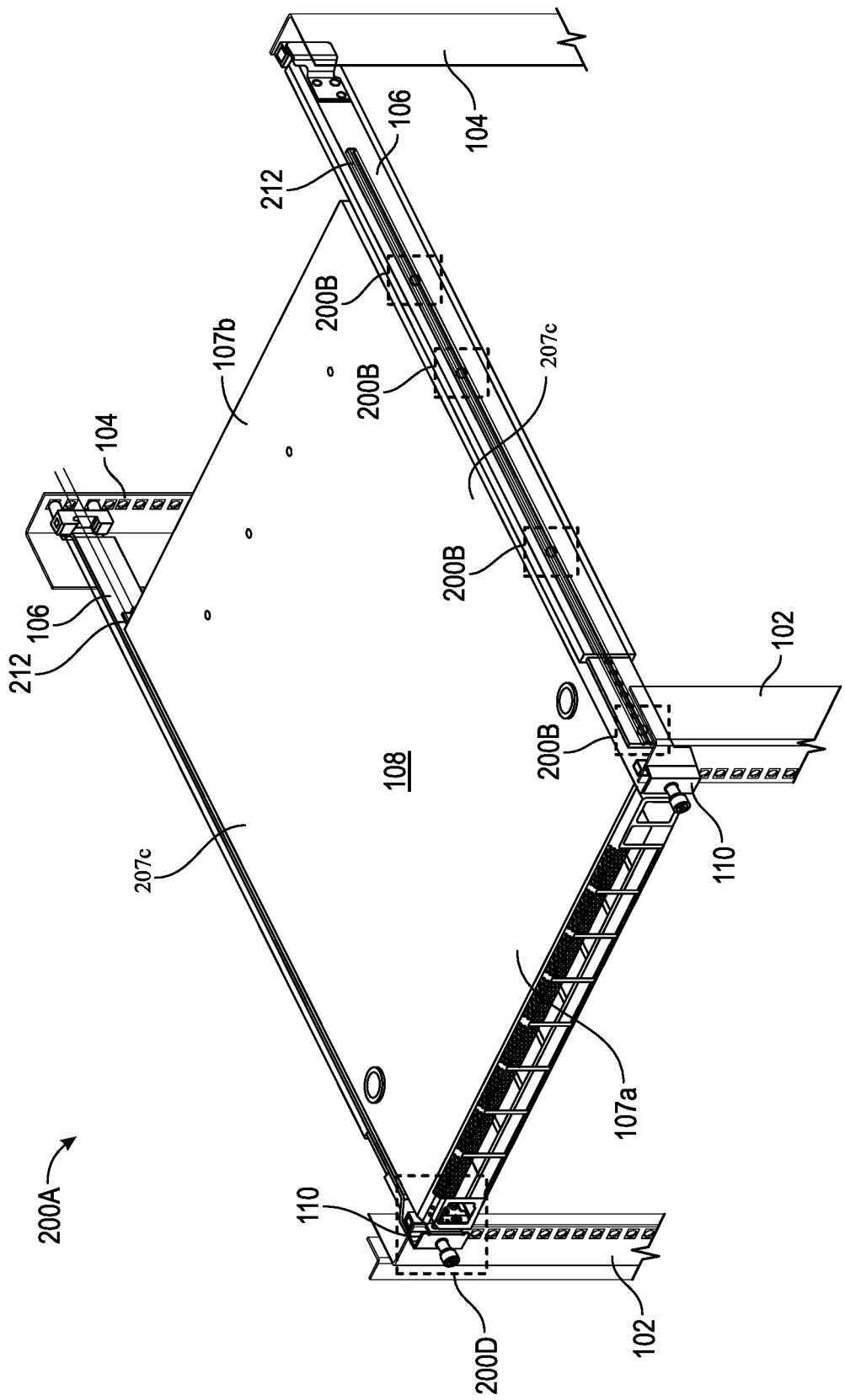
FIG. 2A shows an exemplary rail kit assembly, according to an embodiment of the present disclosure.

In response to the limitations of storage racks, the present disclosure provides a rail kit assembly which provides for different loading orientations and better stabilization of the computing device in the storage rack. FIG. 2A shows an exemplary system 200A which provides for a computing device loaded into a storage rack, according to an embodiment of the present disclosure. System 200A can include many components and similar labels to system 100 of FIG. 1. System 200A can additionally include rail members 212, and pin assemblies 200B. For purposes of the present disclosure, computing device 108 can refer to a computer chassis or any housing which has computer components disposed in the housing.

Figure 2B:
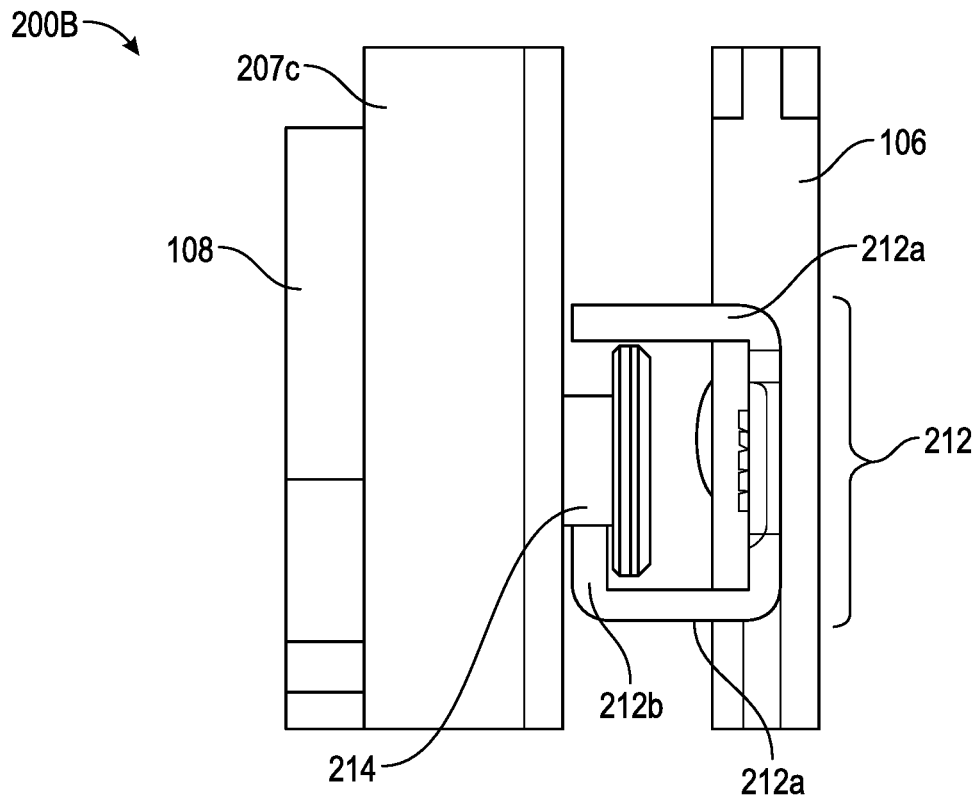
FIG. 2B shows an exemplary rail member and pin assembly, according to an embodiment of the present disclosure.

Rail members 212 can be attached to the rail bodies 106. Rail members 212 can be in a 'c' shape with a slot extending along a horizontal length of the rail member 212. Referring momentarily to FIG. 2B, an exemplary side-perspective of a pin assembly 200B is shown. Rail member 212 can include attachment portions 212a which provide a passage for pins 214 to slide within the rail member 212. Attachment portions 212a can be perpendicular to rail body 106 and can be set apart at a width substantially similar to a diameter of pin 214. Pin 214 can therefore fit snuggly within rail member 212. This snug fit provides stabilization so that computing device 108 cannot move vertically. Additionally, rail member 212 can have a lip portion 212b which helps guide pins 214 along rail member 212. The lip portion 212b can be attached to an upper or lower attachment portion 212a, and can be sized according to an indented portion of pin 214. The lip portion 212b can provide additional stabilization of computing device 108. Pins 214 can slide along rail member 212 when computing device 108 is loaded into or removed from a storage rack. However, the snug fit of pins 213 into rail member 212 can prevent additional horizontal movement when a user is not moving computing device 108 into or out of the storage rack.

Referring back to FIG. 2A, the pin assemblies 200B can be positioned along a side portion 207c of the computing device 108. Although four pin assemblies 200B are pictured in FIG. 2A, an exemplary embodiment can provide for more or fewer pin assemblies 200B, so long as there is at least one pin assembly 200B towards the second end 107b. Therefore, system 200A provides stabilization along side portions 207c of the computing device 108 such that the computing device 108 is held securely within the rail assembly. This can limit damage to the computing devices 108 during shipping or movement.

Figure 2C:
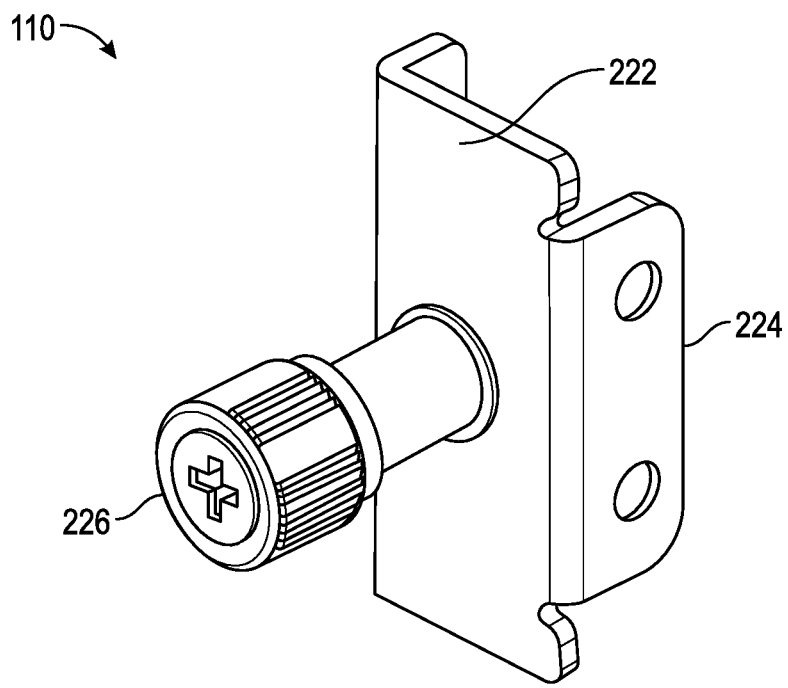
FIG. 2C shows an exemplary locking ear in the system of FIG. 2A, according to an embodiment of the present disclosure.
Figure 2D:
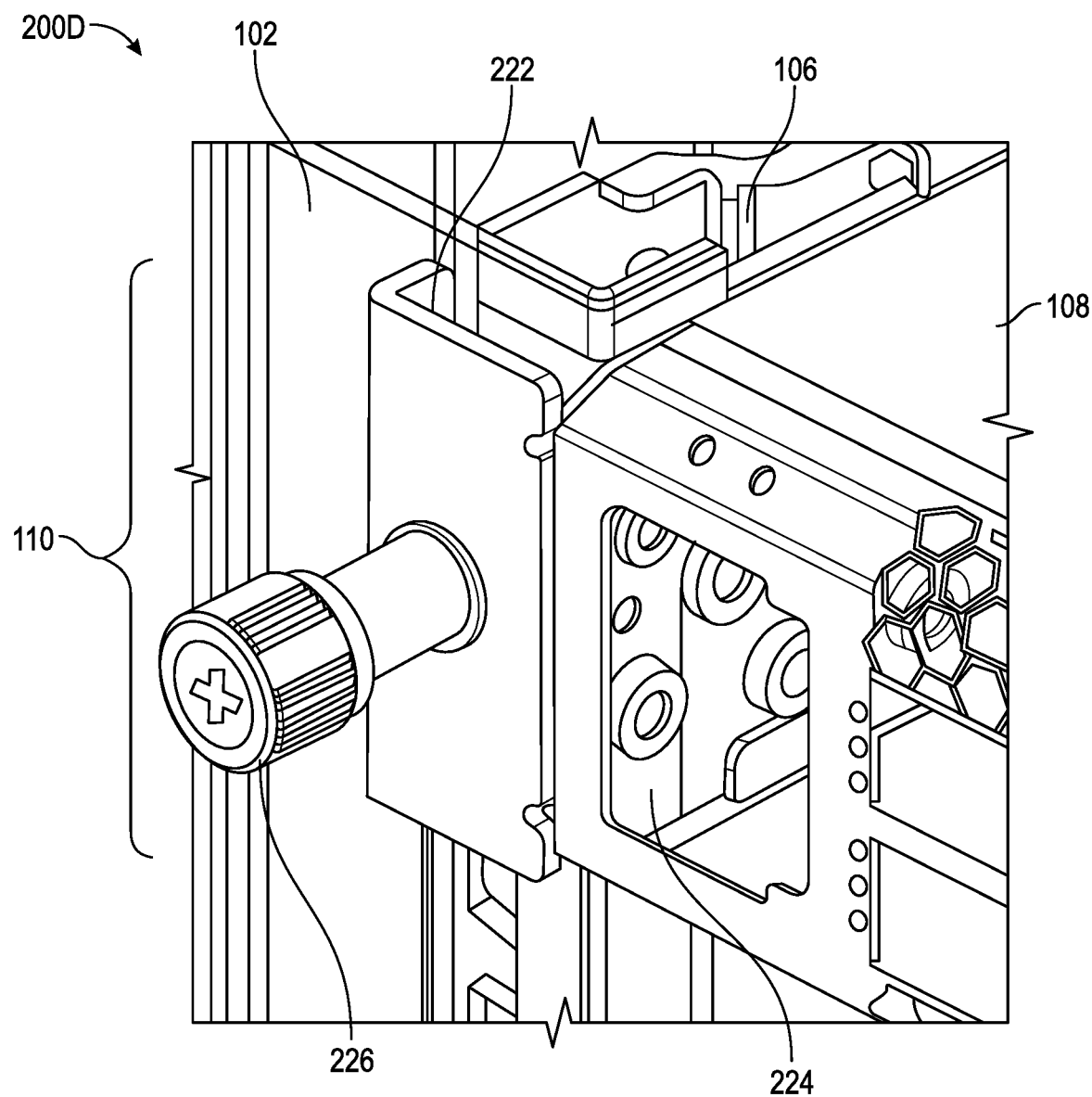
FIG. 2D shows an exemplary locking ear locked onto the rail assembly, according to an embodiment of the present disclosure.

FIG. 2A shows a first orientation, where a first end 107a of the computing device 108 is adjacent to front vertical portions 102. This first orientation is enabled by locking ear 110, which fixes a horizontal position of the first end 107a of the computing device 108 in the rail body 106. Referring momentarily to FIG. 2C, locking ear 110 is shown in greater detail to have a facing surface 222, a tab 224, and a screw 226. Facing surface 222 can be substantially perpendicular to tab 224. FIG. 2D shows a zoomed-in view 200D of locking ear 110 as attached to computing device 108 and rail body 106. Facing surface 222 can be placed adjacent to an end portion of rail body 106. Screw 226 can couple facing surface 222 to rail body 106 and front vertical portions 102 to fix a position of computing device 18. Tab 224 can lie adjacent to computing device 108 and can attach to computing device 108 for additional stability. Therefore, system 200A can interface with locking ear 110 from system 100 of FIG. 1. However, system 200A provides additional stability due to the added support provided by rail bodies 212 and pins 214 (in FIG. 2B).

Figure 3A:
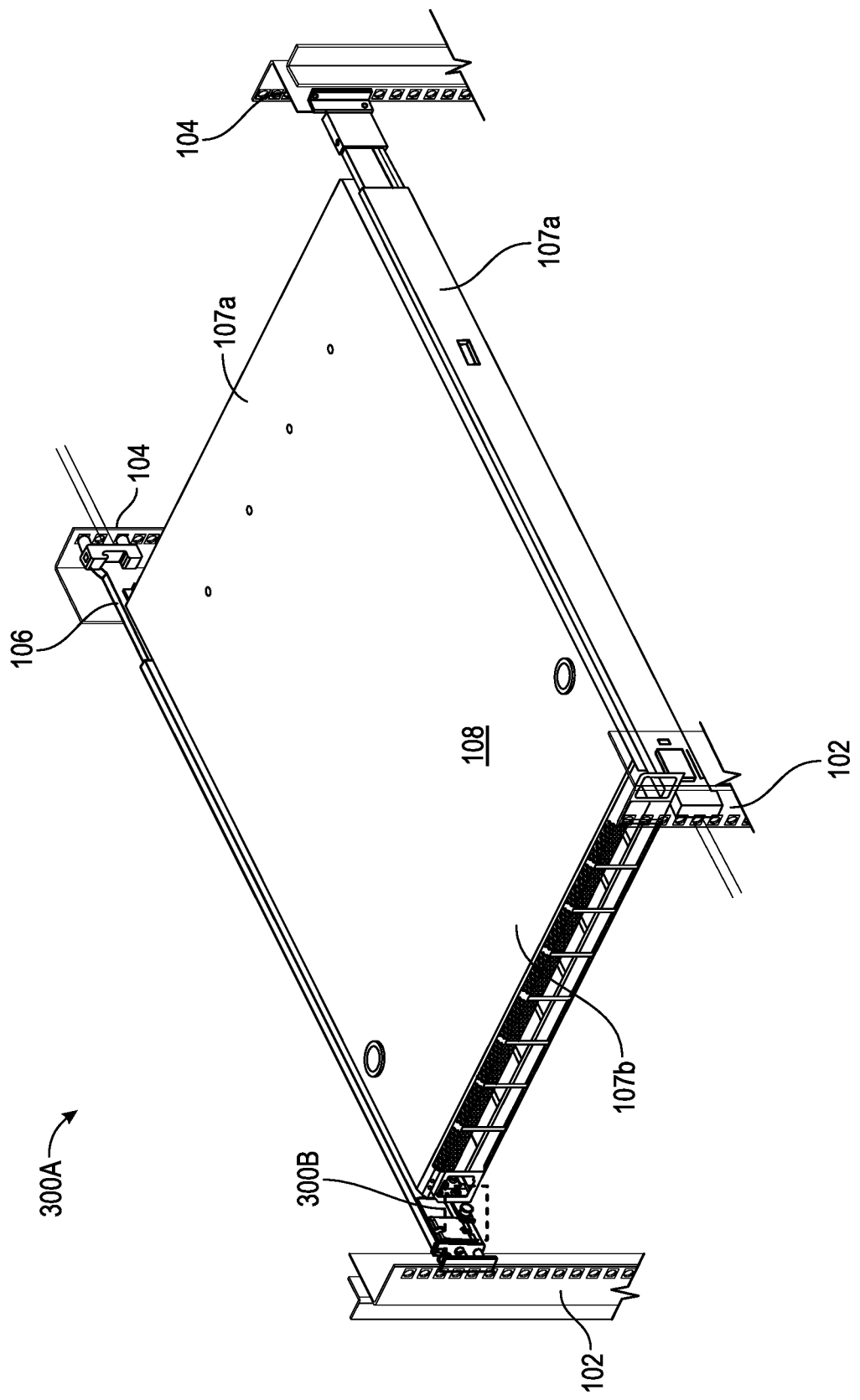
FIG. 3A shows an exemplary inverse orientation of a computer chassis on a rail assembly, according to an embodiment of the present disclosure.
Figure 3B:
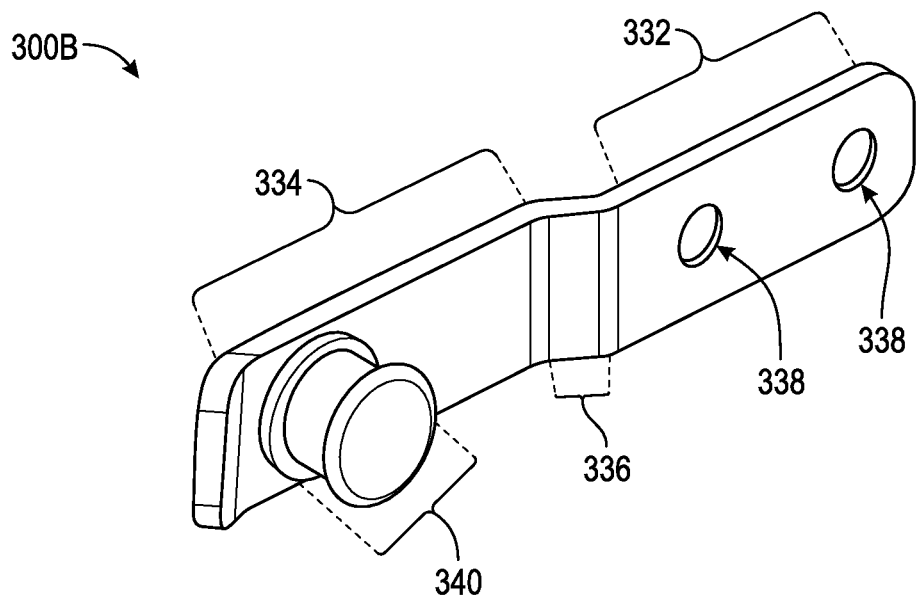
FIG. 3B shows an exemplary locking ear, according to an embodiment of the present disclosure.

FIG. 3A shows an exemplary system 300A, where a computing device 108 can be loaded into a storage rack with a second end 107b accessible to a user. System 300A includes many components and labels similar to system 100 of FIG. 1 and system 200A of FIG. 2A. Although not shown in FIG. 3A, system 300A can include the rail members 212 and pin assemblies 200B of FIGS. 2A-2B. System 300A can additionally include a locking ear 300B which enables a second orientation of the computing device 108. As shown in FIG. 3B, system 300A provides an orientation where the second end 107b of computing device 108 is adjacent to front vertical portions 102. This allows the second end 107b to be accessible by a user while the computing device 108 is loaded into a storage rack. This second orientation can be referred to as an inverse orientation. This orientation is enabled by locking ear 300B, as shown in detail in FIG. 3B. Locking ear 300B can include a first end 332, a second end 334, a middle portion 336, receiving elements 338, and a plunger 340.

The first end 332 can attach to a computing device. For example, screws (not pictured) can fit through the receiving elements 338 to attach to a computing device. The second end 334 can couple with a rail body via a plunger 340. The plunger 340 can have an indented portion 342 and a lip 344.

The indented portion 342 can fit into an opening or slot in a rail body. The lip 344 can prevent the plunger from becoming removed from such an opening during jostling of the storage rack.

Locking ear 300B can further include a middle portion 336. The middle portion 336 can extend at an angle away from a first end 332, where the first end 332 lies adjacent to a computing device. The middle portion 336 can therefore extend towards a rail body 106. The middle portion 336 can extend at a set angle, such that the indented portion 342 of the plunger 340 is in line with the first end 332. Such an angle allows the locking ear 300B to couple a computing device 108 to a rail body 106 where the computing device 108 can lie adjacent to the rail body 106 along a full length of the rail body 106 (pictured in FIG. 3A).

Figure 3C:
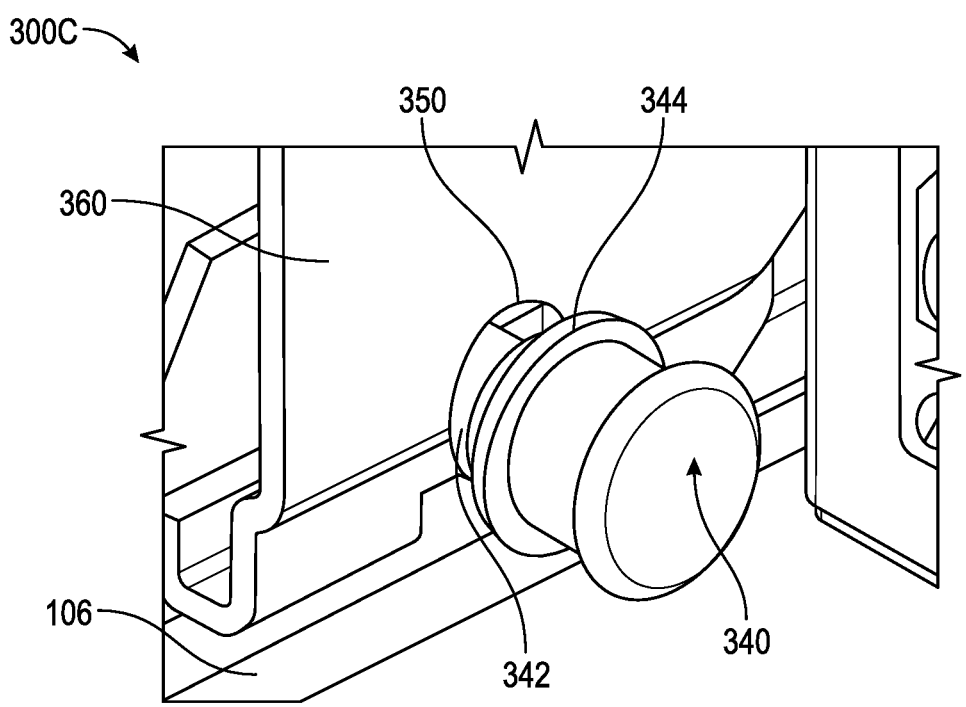
FIG. 3C shows an exemplary locking ear in a rail body, according to an embodiment of the present disclosure.

FIG. 3C shows a zoomed-in, assembled perspective 300C of the coupling between a rail body 106 and a plunger 340. A rail body 106 can include an opening 350 configured to receive plunger 340. The plunger 340 can slide into the opening 350 along the indented portion 342. The lip 344 can prevent the plunger 340 from coming out of the opening 350 unless the computing device 108 is removed by a user. The plunger 340 can be configured to slide into opening 350 and lock into place once received by a receiving element 360 of the rail body 106.

Figure 3D:
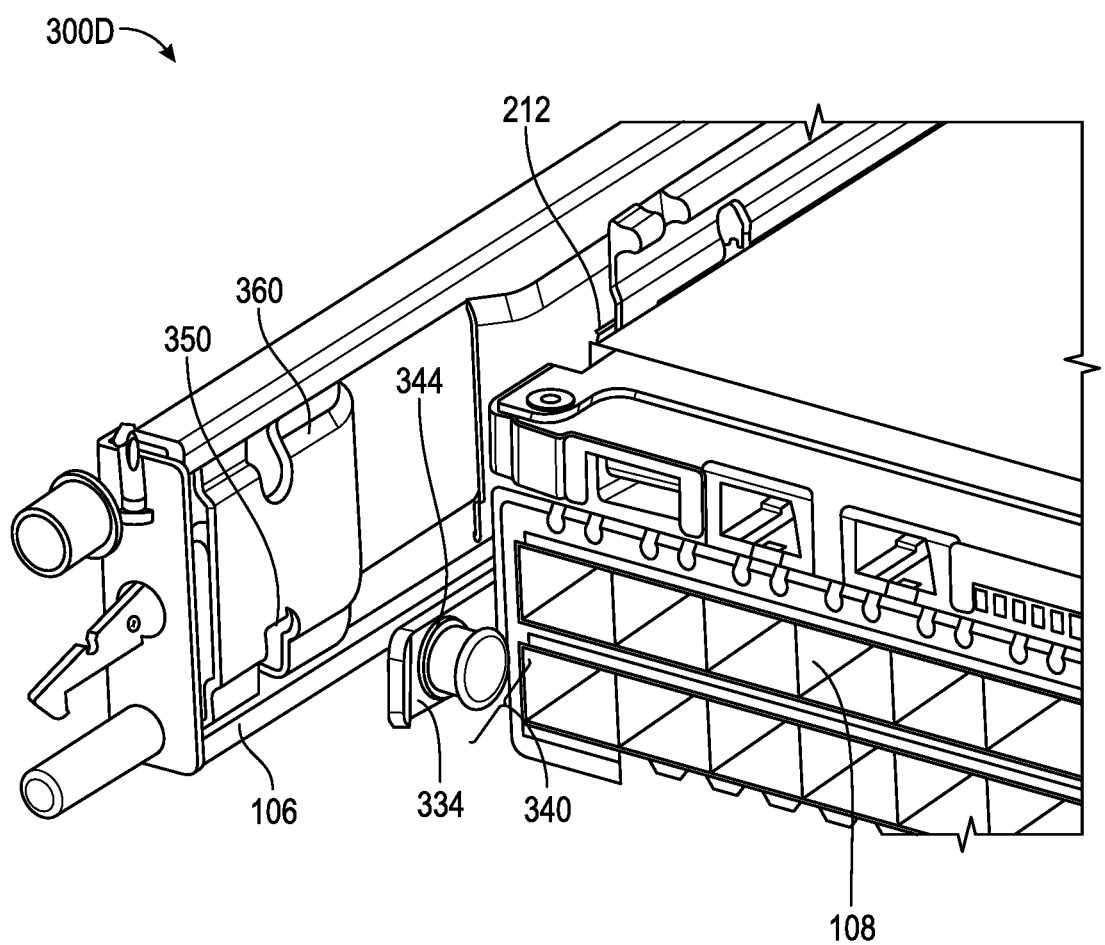
FIG. 3D shows an exemplary disassembled view of a locking ear in a rail body, according to an embodiment of the present disclosure.

FIG. 3D shows a zoomed-out, disassembled perspective 300D of how a rail body 106 can couple to a plunger 340. As can be seen in FIG. 3D, the plunger 340 can slide along into an opening 350 of a receiving element 360 at an end of a rail body 106.

Therefore, FIGS. 3A-3D show a system 300A which uses a locking ear 300B. The locking ear 300B can allow a computing device 108 to be loaded into a storage rack in an inverse orientation, where a second end 107b is adjacent to front vertical portions 102 of the storage rack.

Altogether, a user can choose whether to use locking ear 110 from FIGS. 2A and 2C-2D, or locking ear 300B from FIGS. 3A-3D. A user can decide based on whether the user desires access to a first end 107a or a second end 107b of the computing device 108, once the computing device 108 has been loaded.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including,"

"includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A rail assembly for a computing device in a storage rack with front vertical portions and opposing rear vertical portions, comprising:
    a rail body configured to engage with one of the front vertical portions and an opposing one of the rear vertical portions;
    a rail member, including one more attachment portions, fixably attached to the rail body along the length of the rail member and configured with a slot extending horizontally along the rail member for slidably receiving a plurality of pins disposed along a side surface of the computing device when the computing device is in either a first orientation or a second orientation; and
    a locking ear configured for fixing a horizontal position of the computing device along the rail member, the locking ear couplable to the computing device to support the computing device in both the first orientation and the second orientation of the computing device in the storage rack,
    wherein changing between the first orientation and the second orientation includes reloading the computing device from the rail assembly,
    wherein the first orientation is a loaded position of the computing device within the storage rack between the front vertical portions and the rear vertical portions, and
    wherein the second orientation is a loaded position of the computing device within the storage rack, different from the first orientation, between the front vertical portions and the rear vertical portions.

2. The rail assembly of claim 1, wherein the rail member is a C-shaped rail.

3. The rail assembly of claim 1, wherein the computing device comprises a first end and a second end, wherein the first end of the computing device is positioned adjacent to the front vertical portions and the second end of the computing device is positioned adjacent to the rear vertical portions in the first orientation, and wherein the second end of the computing device is positioned adjacent to the front vertical portions and the first end of the computing device is positioned adjacent to the rear vertical portions in the second orientation.

4. The rail assembly of claim 3, wherein the locking ear for the first orientation comprises a facing surface and a tab, wherein the facing surface attaches to the front vertical portions of the storage rack, and the tab attaches to the computing device.

5. The rail assembly of claim 4, wherein the facing surface is substantially perpendicular to the tab.

6. The rail assembly of claim 3, wherein the locking ear for the second orientation comprises a first end configured to attach to the computing device and a second end configured to couple with the rail body.

7. The rail assembly of claim 6, wherein the second portion comprises a plunger.

8. The rail assembly of claim 7, wherein the plunger comprises a lip and an indented portion.

9. The rail assembly of claim 8, wherein the locking ear further comprises a middle portion extending away from the first end at an angle such that the indented portion of the plunger is in line with the first end.

10. The rail assembly of claim 9, wherein the rail body comprises an opening configured to receive the plunger.

11. A storage rack configured to house a plurality of computing devices, comprising:
    front vertical portions;
    rear vertical portions configured to oppose the front vertical portions;
    a plurality of rail bodies, wherein each of the plurality of rail bodies is configured to engage with one of the front vertical portions and an opposing one of the rear vertical portions;
    a plurality of rail members, wherein each of the plurality of rail members includes one more attachment portions, is fixably attached to one of the plurality of rail bodies along the length of one or more of the plurality of rail members, and further comprises a horizontal slot along the rail member, wherein the horizontal slot is configured for slidably receiving a plurality of pins disposed along a side surface of one computing device of the plurality of computing devices when the one computing device is in either a first orientation or a second orientation; and
    a plurality of locking ears, wherein each of the plurality of locking ears is configured for fixing a horizontal position of the one computing device along the rail member, and further couplable to the one computing device to support the one computing device in both the first orientation and the second orientation of one of the plurality of computing devices in the storage rack,
    wherein changing between the first orientation and the second orientation includes reloading the computing device from the rail assembly,
    wherein the first orientation is a loaded position of the computing device within the storage rack between the front vertical portions and the rear vertical portions, and
    wherein the second orientation is a loaded position of the computing device within the storage rack, different from the first orientation, between the front vertical portions and the rear vertical portions.

12. The storage rack of claim 11, wherein each rail member is a C-shaped rail.

13. The storage rack of claim 11, wherein each of the plurality of computing devices comprises a first end and a second end, wherein, when in the first orientation, the first end is positioned adjacent to the front vertical portions and the second end of the computing device is positioned adjacent to the rear vertical portions, and wherein, when in the second orientation, the second end is positioned adjacent to the front vertical portions and the first end of the computing device is positioned adjacent to the rear vertical portions.

14. The storage rack of claim 13, wherein each of the plurality of locking ears comprises a facing surface and a tab, wherein the facing surface attaches to the front vertical portions of the rack, and the tab attaches to one of the plurality of computing devices.

15. The storage rack of claim 14, wherein the facing surface is substantially perpendicular to the tab.

16. The storage rack of claim 13, wherein each of the plurality of locking ears comprises a first end configured to attach to one of the plurality of computing devices and a second end configured to couple with one of the plurality of rail bodies.

17. The storage rack of claim 16, wherein the second end comprises a plunger.

18. The storage rack of claim 17, wherein the plunger comprises a lip and an indented portion.

19. The storage rack of claim 18, wherein each of the plurality of locking ears further comprises a middle portion extending away from the first end at an angle such that the indented portion of the plunger is in line with the first end.

20. The storage rack of claim 19, wherein each of the plurality of rail bodies comprises an opening configured to receive the plunger.

* * * * *